United States Patent [19]

Schantz, Jr. et al.

[11] Patent Number: 5,510,725
[45] Date of Patent: Apr. 23, 1996

[54] METHOD AND APPARATUS FOR TESTING A POWER BRIDGE FOR AN ELECTRIC VEHICLE PROPULSION SYSTEM

[75] Inventors: David L. Schantz, Jr., Ellicott City; William B. Hall, Annapolis; William B. Winkel, Bowie, all of Md.; Geoffrey B. Lansberry, Cambridge, Mass.

[73] Assignee: Westinghouse Electric Corp., Pittsburgh, Pa.

[21] Appl. No.: 258,178

[22] Filed: Jun. 10, 1994

[51] Int. Cl.⁶ .................................................. G01R 31/26
[52] U.S. Cl. ...................... 324/768; 324/537; 324/769; 340/645
[58] Field of Search .................................. 324/537, 765, 324/766, 768, 769; 340/635, 644, 645, 648; 361/100, 101

[56] References Cited

U.S. PATENT DOCUMENTS

| | | |
|---|---|---|
| 3,852,656 | 12/1974 | Boutbeau . |
| 4,142,151 | 2/1979 | Hansen . |
| 4,538,106 | 8/1985 | Anderson ............................... 324/768 |
| 4,631,474 | 12/1986 | Dolland . |
| 4,691,143 | 9/1987 | Lange ................... 340/644 X |
| 5,111,123 | 5/1992 | Hach et al. . |
| 5,202,589 | 4/1993 | Hüser ................... 340/644 X |
| 5,223,821 | 6/1993 | Poe et al. ........................ 340/645 |
| 5,285,119 | 2/1994 | Takahashi .......................... 324/769 X |

FOREIGN PATENT DOCUMENTS

| | | |
|---|---|---|
| 0073943 | 8/1982 | European Pat. Off. . |
| 0413938 | 7/1990 | European Pat. Off. . |
| 0458300 | 5/1991 | European Pat. Off. . |
| 0609158 | 1/1994 | European Pat. Off. . |
| 2680007 | 5/1992 | France . |
| 2689823 | 7/1992 | France . |
| 2242580 | 10/1991 | United Kingdom . |
| 9411747 | 5/1994 | WIPO . |

*Primary Examiner*—Kenneth A. Wieder
*Assistant Examiner*—Diep Do

[57] ABSTRACT

A method for testing a power bridge for an electric vehicle propulsion system, the power bridge including a switching circuit having first and second switching elements operable between "on" and "off" states. The method comprises the steps of selectively switching the first and second switching elements between the "on" and "off" states, monitoring the first and second switching elements to determine whether the first and second switching elements operate between the "on" and "off" states when selectively switched, and indicating a failure o# the switching circuit when at least one of the first and second switching elements does not operate between the "on" and "off" states when selectively switched.

8 Claims, 10 Drawing Sheets

METHOD AND APPARATUS FOR TESTING A POWER BRIDGE FOR AN ELECTRIC VEHICLE PROPULSION SYSTEM

RELATED APPLICATIONS

The following identified U.S. patent applications are filed on the same date as the instant application and are relied upon and incorporated by reference in this application.

U.S. patent application entitled "Flat Topping Concept" bearing attorney docket No. 58,295, Ser. No. 08/258,295, and filed on the same date herewith;

U.S. patent application entitled "Electric Induction Motor And Related Method Of Cooling" bearing attorney docket No. 58,332, Ser. No. 08/258,150, and filed on the same date herewith;

U.S. patent application entitled "Automotive 12 Volt System For Electric Vehicles" bearing attorney docket No. 58,333, Ser. No. 08/258,142, and filed on the same date herewith;

U.S. patent application entitled "Direct Cooled Switching Module For Electric Vehicle Propulsion System" bearing attorney docket No. 58,334, Ser. No. 08/258,027, and filed on the same date herewith;

U.S. patent application entitled "Electric Vehicle Propulsion System" bearing attorney docket No. 58,335, Ser. No. 08/258,301, and filed on the same date herewith;

U.S. patent application entitled "Speed Control and Bootstrap Technique For High Voltage Motor Control" bearing attorney docket No. 58,336, Ser. No. 08/125,294, and filed on the same date herewith;

U.S. patent application entitled "Vector Control Board For An Electric Vehicle Propulsion System Motor Controller" bearing attorney docket No. 58,337, Ser. No. 08/258,306, and filed on the same date herewith;

U.S. patent application entitled "Digital Pulse Width Modulator With Integrated Test And Control" bearing attorney docket No. 58,338, Ser. No. 08/258,305, and filed on the same date herewith;

U.S. patent application entitled "Control Mechanism For Electric Vehicle" bearing attorney docket No. 58,339, Ser. No. 08/258,144, and filed on the same date herewith;

U.S. patent application entitled "Improved EMI Filter Topology for Power Inverters" bearing attorney docket No. 58,340, Ser. No. 08/258,153, and filed on the same date herewith;

U.S. patent application entitled "Fault Detection Circuit For Sensing Leakage Currents Between Power Source And Chassis" bearing attorney docket No. 58,341, Ser. No. 08/258,179 and filed on the same date herewith;

U.S. patent application entitled "Electric Vehicle Relay Assembly" bearing attorney docket No. 58,342, Ser. No. 08/258,177, and filed on the same date herewith;

U.S. patent application entitled "Three Phase Power Bridge Assembly" bearing attorney docket No. 58,343, Ser. No. 08/258,033, and filed on the same date herewith;

U.S. patent application entitled "Electric Vehicle Propulsion System Power Bridge With Built-In Test" bearing attorney docket No. 58,344, Ser. No. 08/258,034, and filed on the same date herewith;

U.S. patent application entitled "Electric Vehicle Power Distribution Module" bearing attorney docket No. 58,346, Ser. No. 08/258,157, and filed on the same date herewith;

U.S. patent application entitled "Electric Vehicle Chassis Controller" bearing attorney docket No. 58,347, Ser. No. 08/258,628, and filed on the same date herewith;

U.S. patent application entitled "Electric Vehicle System Control Unit Housing" bearing attorney docket No. 58,348, Ser. No. 08/258,136, and filed on the same date herewith;

U.S. patent application entitled "Low Cost Fluid Cooled Housing For Electric Vehicle System Control Unit" bearing attorney docket No. 58,349, Ser. No. 08/258,299, and filed on the same date herewith;

U.S. patent application entitled "Electric Vehicle Coolant Pump Assembly" bearing attorney docket No. 58,350, Ser. No. 08/258,296, and filed on the same date herewith;

U.S. patent application entitled "Heat Dissipating Transformer Coil" bearing attorney docket No. 58,351, Ser. No.08/258,141, and filed on the same date herewith;

U.S. patent application entitled "Electric Vehicle Battery Charger" bearing attorney docket No. 58,352, Ser. No. 08/258,154, and filed on the same date herewith.

BACKGROUND OF THE INVENTION

1. Field of the Invention

The present invention relates to a method for testing a power bridge. More particularly, the present invention relates to a method for testing an electric vehicle propulsion system power bridge. While the invention is subject to a wide range of applications, it is especially suited for use in electric vehicles that utilize batteries or a combination of batteries and other sources, e.g., a heat engine coupled to an alternator, as a source of power, and will be particularly described in that connection.

2. Description of the Related Art

For an electric vehicle to be commercially viable, its cost and performance should be competitive with that of its gasoline-powered counterparts. Typically, the vehicle's propulsion system and battery are the main factors which contribute to the vehicle's cost and performance competitiveness.

Generally, to achieve commercial acceptance, an electric vehicle propulsion system should provide the following features: (1) vehicle performance equivalent to typical gasoline-powered propulsion systems; (2) smooth control of vehicle propulsion; (3) regenerative braking; (4) high efficiency; (5) low cost; (6) self-cooling; (7) electromagnetic interference (EMI) containment; (8) fault detection and self-protection; (9) self-test and diagnostics capability; (10) control and status interfaces with external systems; (11) safe operation and maintenance; (12) flexible battery charging capability; and (13) auxiliary 12 volt power from the main battery. In prior practice, however, electric vehicle propulsion system design consisted largely of matching a motor and controller with a set of vehicle performance goals, such that performance was often sacrificed to permit a practical motor and controller design. Further, little attention was given to the foregoing features that enhance commercial acceptance.

A typical conventional electric vehicle propulsion system comprises, among other things, a power bridge including high-power electronic switches for supplying current to the windings of a motor. When one or more of these switches fails, manual diagnostic testing of the power bridge is performed to detect and isolate the failed transistor(s). Manual testing of the switching transistors, however, can be both costly and time consuming as it often requires trial and error techniques.

3

SUMMARY OF THE INVENTION

Accordingly, the present invention is directed to an electric vehicle propulsion system power bridge that substantially obviates one or more of the problems due to the limitations and disadvantages of the related art.

Features and advantages of the invention will be set forth in the description which follows, and in part will be apparent from the description, or may be learned by practice of the invention. The objectives and other advantages of the invention will be realized and attained by the method and apparatus particularly pointed out in the written description and claims thereof as well as the appended drawings.

To achieve these and other advantages and in accordance with the purpose of the invention, as embodied and broadly described, the invention provides for a method for testing a power bridge for an electric vehicle propulsion system, the power bridge including a switching circuit having first and second switching elements operable between "on" and "off" states, the method comprising the steps of selectively switching the first and second switching elements between the "on" and "off" states, monitoring the first and second switching elements to determine whether the first and second switching elements operate between the "on" and "off" states when selectively switched, and indicating a failure of the switching circuit when at least one of the first and second switching elements does not operate between the "on" and "off" states when selectively switched.

In another aspect, the invention provides for a method for testing a power bridge for an electric vehicle propulsion system, the power bridge including a plurality of switching circuits each having first and second switching elements operable between "on" and "off" states, the method comprising the steps of selectively switching the first and second switching elements between the "on" and "off" states, monitoring the first and second switching elements of one of the plurality of switching circuits to determine whether the first and second switching elements of the one of the plurality of switching circuits operate between the "on" and "off" states when selectively switched, and indicating a failure of the switching circuit when at least one of the first and second switching elements of the one of the plurality of switching circuits does not operate between the "on" and "off" states when selectively switched.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate a presently preferred embodiment of the invention and, together with the description, serve to explain the principles of the invention. In the drawings.

DESCRIPTION OF THE PREFERRED EMBODIMENT

Reference will now be made in detail to a present preferred embodiment of the invention, an example of which is illustrated in the accompanying drawings.

Figure 1:
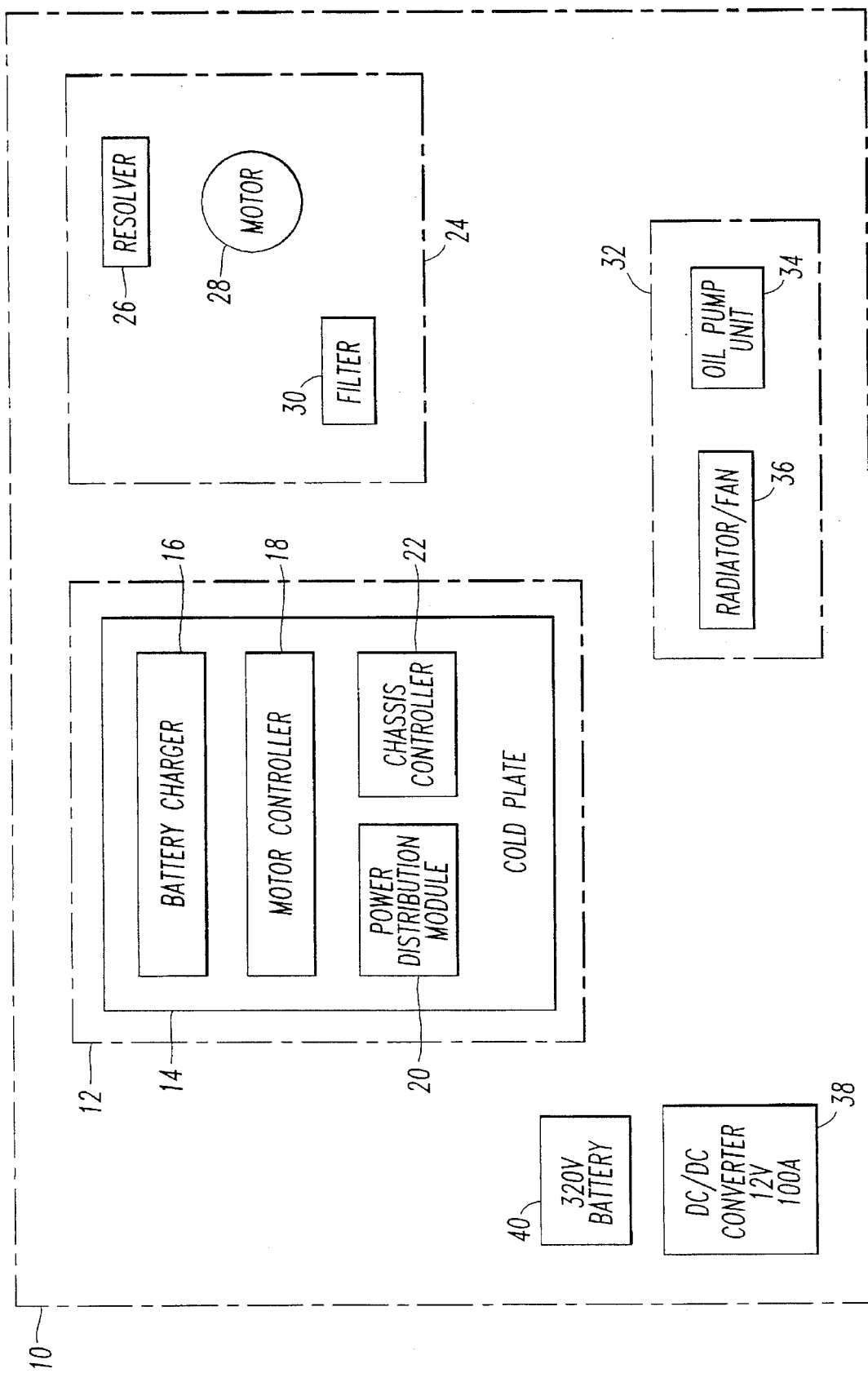
FIG. 1 is a block diagram of an electric vehicle propulsion system in accordance with a preferred embodiment of the invention.

As shown in FIG. 1, there is provided an electric vehicle propulsion system 10 comprising a system control unit 12, a motor assembly 24, a cooling system 32, a battery 40, and a DC/DC converter 38. The system control unit 12 includes a cold plate 14, a battery charger 16, a motor controller 18, a power distribution module 20, and a chassis controller 22. The motor assembly 24 includes a resolver 26, a motor 28, and a filter 30. The cooling system 32 includes an oil pump unit 34 and a radiator/fan 36.

Figure 2:
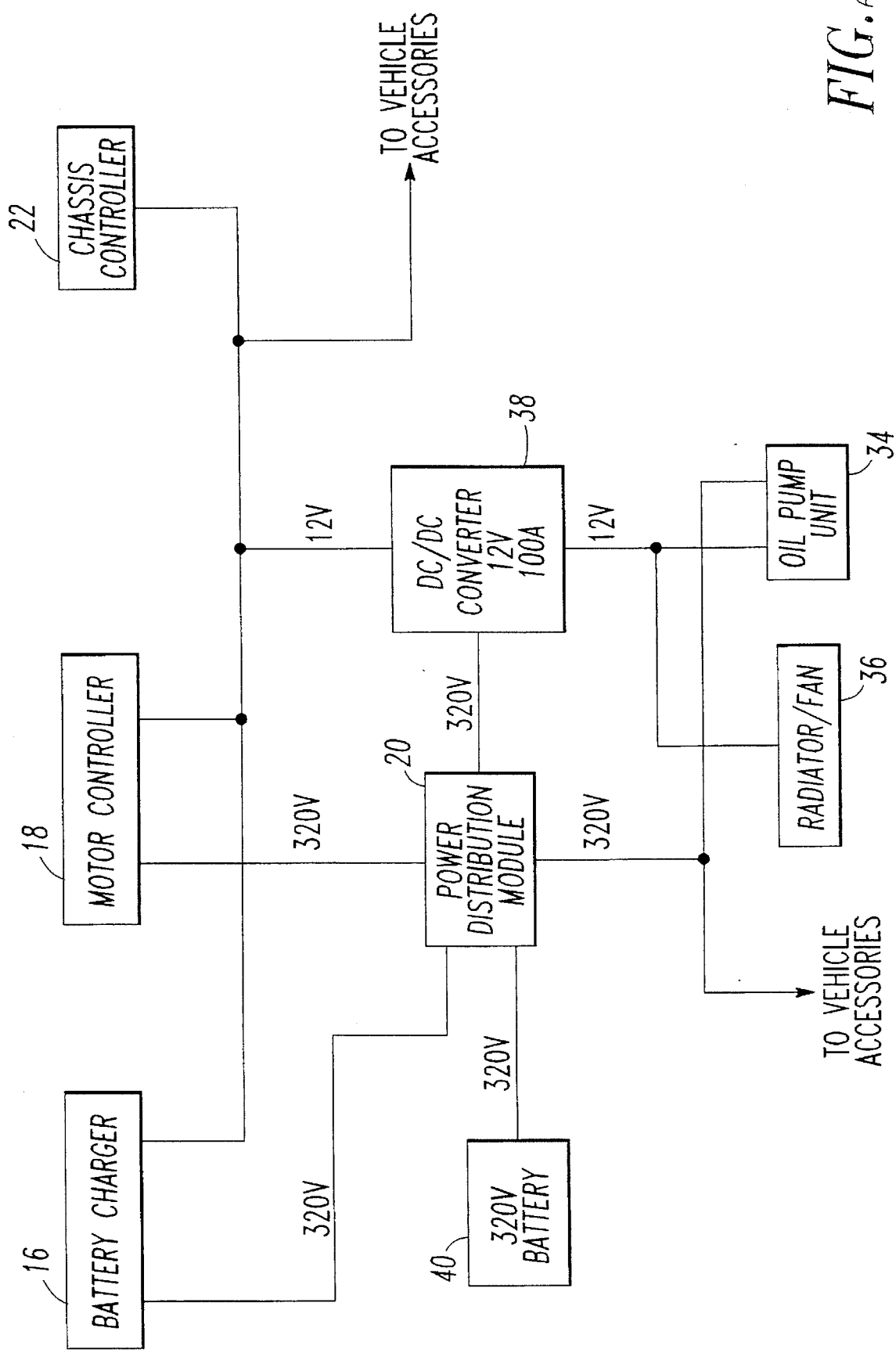
FIG. 2 is a power distribution diagram of the electric vehicle propulsion system of FIG. 1.

As shown in FIG. 2, the battery 40 serves as the primary source of power for the electric propulsion system 10. The battery 40 comprises, for example, a sealed lead acid battery, a monopolar lithium metal sulfide battery, a bipolar lithium metal sulfide battery, or the like, for providing a 320 volt output. Preferably, the electric propulsion system 10 works over a wide voltage range, e.g., 120 volts to 400 volts, to accommodate changes in the output voltage of the battery 40 due to load or depth of discharge. However, the electric vehicle propulsion system 10 is preferably optimized for nominal battery voltages of about 320 volts.

The power distribution module 20 is coupled to the output of the battery 40 and includes, among other things, fuses, wiring, and connectors for distributing the 320 volt output from the battery 40 to various components of the electric vehicle propulsion system 10. For example, the power distribution module 20 distributes the 320 volt output from the battery 40 to the motor controller 18, the DC/DC converter 38, the oil pump unit 34, and battery charger 16. The power distribution module 20 also distributes the 320 volt output from the battery 40 to various vehicle accessories, which are external to the electric vehicle propulsion system 10. These vehicle accessories include, for example, an air conditioning system, a heating system, a power steering system, and any other accessories that may require a 320 volt power supply.

The DC/DC converter 38, which, as described above, is coupled to the 320 volt output of the power distribution module 20, converts the 320 volt output of the power distribution module 20 to 12 volts. The DC/DC converter 38 then supplies its 12 volt output as operating power to the battery charger 16, the motor controller 18, the chassis controller 22, the oil pump unit 34, and the radiator/fan 36. The DC/DC converter 38 also supplies its 12 volt output as operating power to various vehicle accessories, which are external to the electric vehicle propulsion system 10. These vehicle accessories include, for example, vehicle lighting, an audio system, and any other accessories that may require a 12 volt power supply. It should be appreciated that the DC/DC converter 38 eliminates the need for a separate 12 volt storage battery.

Operation of the electric vehicle propulsion system 10 will now be described with reference to FIGS. 3–9.

Figure 3:
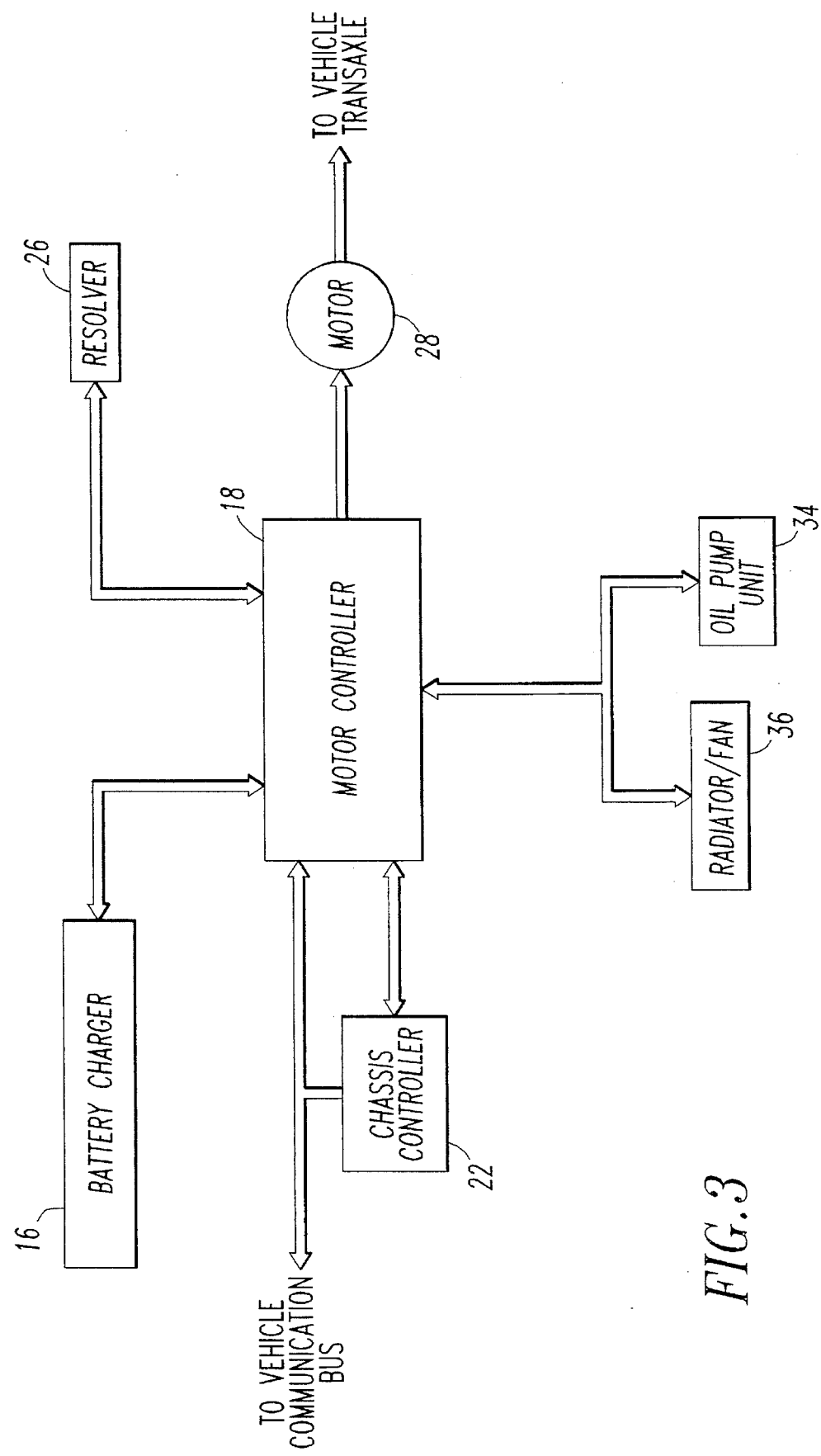
FIG. 3 is a functional diagram of the electric vehicle propulsion system of FIG. 1.
Figure 4:
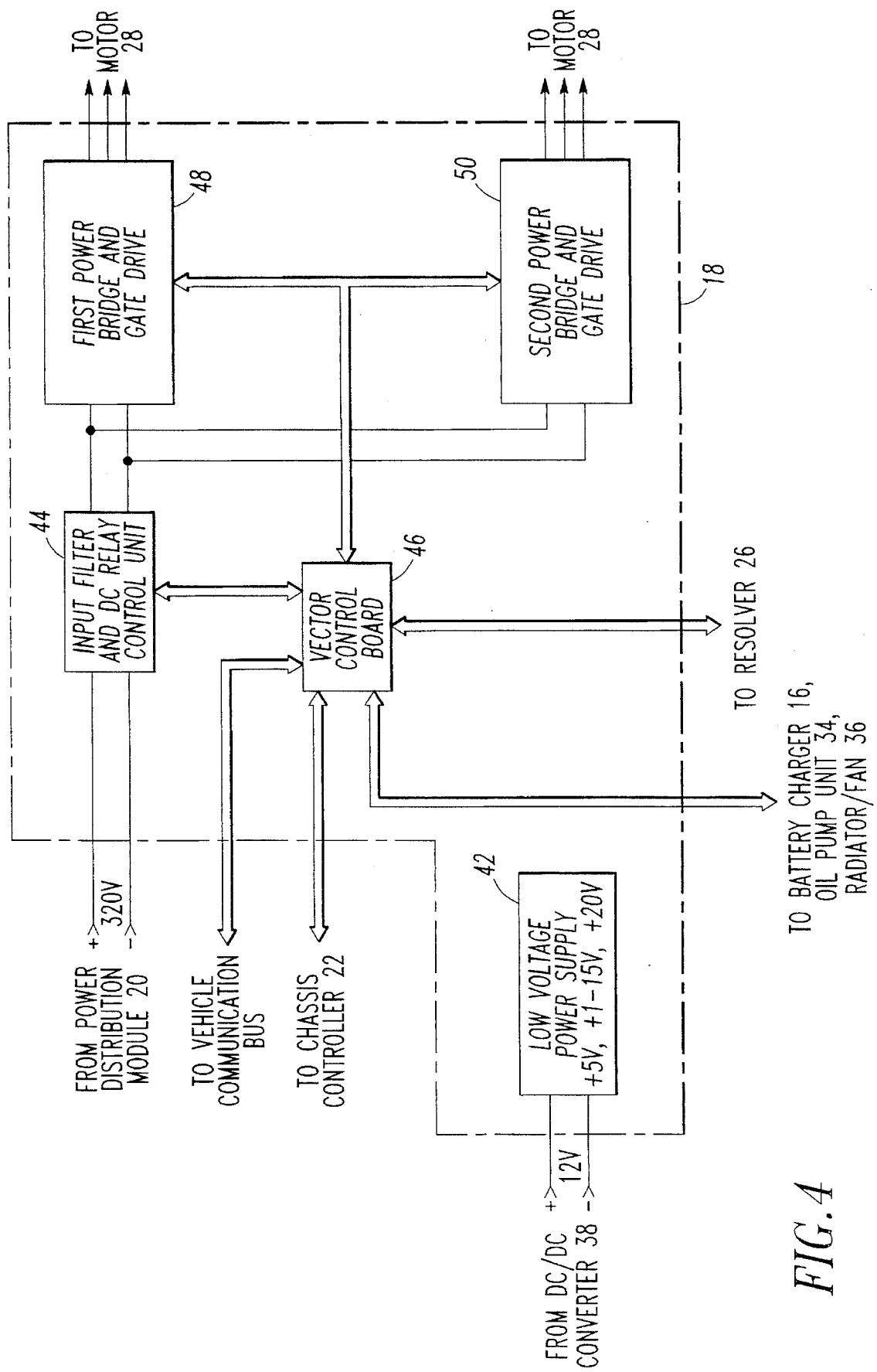
FIG. 4 is a functional diagram of the motor controller of the electric vehicle propulsion system of FIG. 1.

As shown in FIGS. 3 and 4, the components of the electric vehicle propulsion system 10 are interconnected via various data busses. The data busses can be of the electrical, optical, or electro-optical type as is known in the art.

The battery charger 16 receives command signals from and sends status signals to the motor controller 18 for charging the battery 40. The battery charger 16 provides a controlled battery charging current from an external AC power source (not shown). Preferably, AC current is drawn from the external source at near-unity power factor and low harmonic distortion in compliance with expected future power quality standards. Further, the battery charger 16 is preferably designed to be compatible with standard ground fault current interrupters and single-phase power normally found at residential locations.

Figure 5:
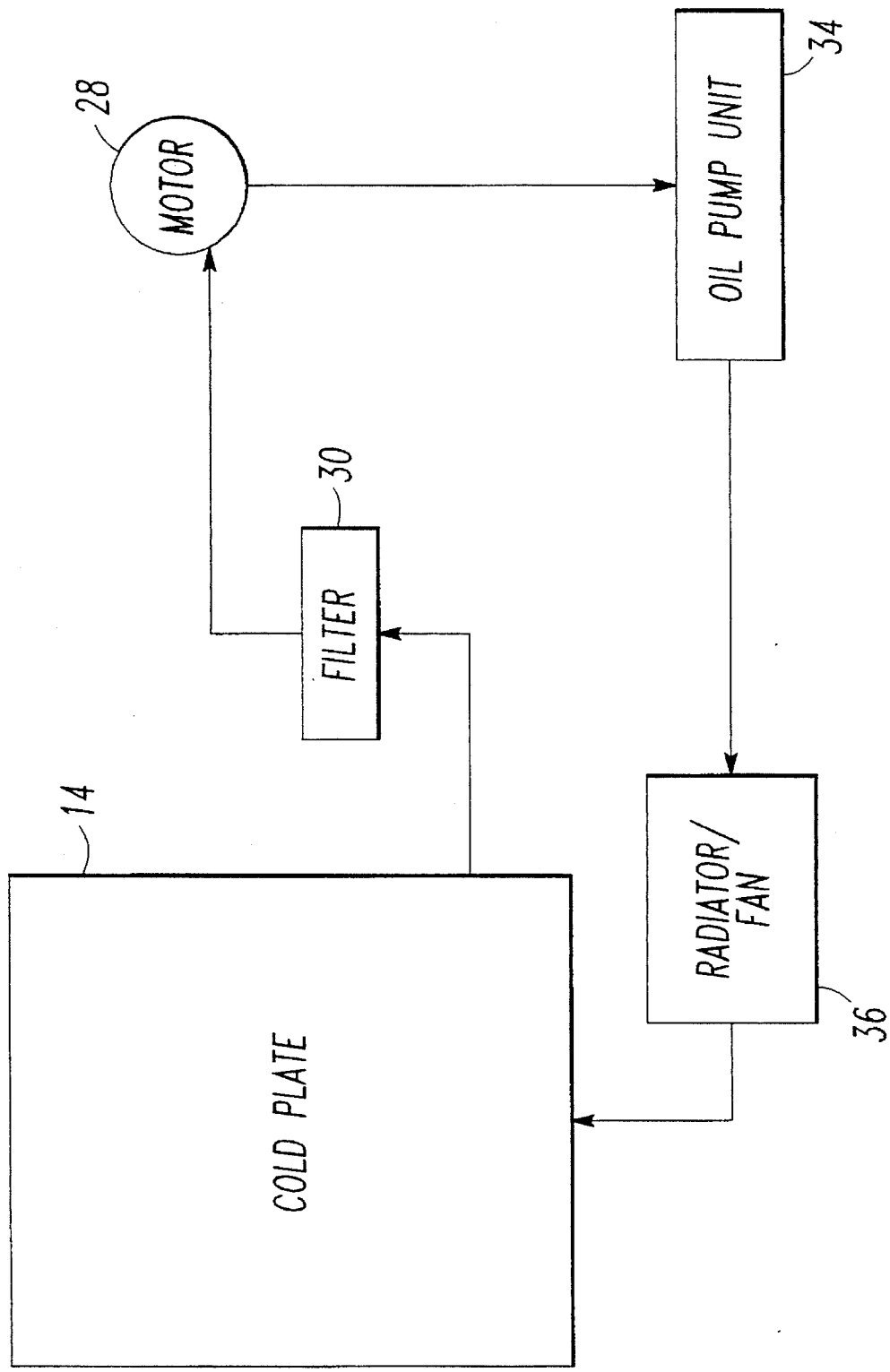
FIG. 5 is a cooling diagram of the electric vehicle propulsion system of FIG. 1.

The oil pump unit 34 and radiator/fan 36 also receive command signals from and send status signals to the motor controller 18. As shown in FIG. 5, the electric vehicle propulsion system 10 utilizes a closed loop cooling system including the cold plate 14, the filter 30, the motor 28, the oil pump unit 34, and the radiator/fan 36. Preferably, the cold plate 14 is a hollow body having a double-sided surface on which the battery charger 16, the motor controller 18, and the power distribution module 20 are mounted in thermal contact. It is contemplated that the DC/DC converter 38 can also be mounted in thermal contact with the cold plate 14. The oil pump unit 34 circulates oil, e.g., aircraft turbine oil, from the oil reservoir of the motor 28 through the radiator/fan 36, the cold plate 14, the filter 30, and back through the motor 28 as shown in FIG. 5. Heat is removed from the oil by the radiator/fan 36 and the oil is filtered by the filter 30, which can comprise a commercially available oil filter known in the art. Preferably, the oil pump unit 34 is controlled by the motor controller 18 to provide a variable rate of oil flow. It should be appreciated that the closed loop oil cooling system of FIG. 5 protects the electric vehicle propulsion system 10 from the harsh automotive operating environment, thus increasing reliability and reducing maintenance. Further, because the same oil used for lubricating the motor 28 is also used for cooling of the system control unit 12, the cooling system can have a simplified design.

Figure 6A:
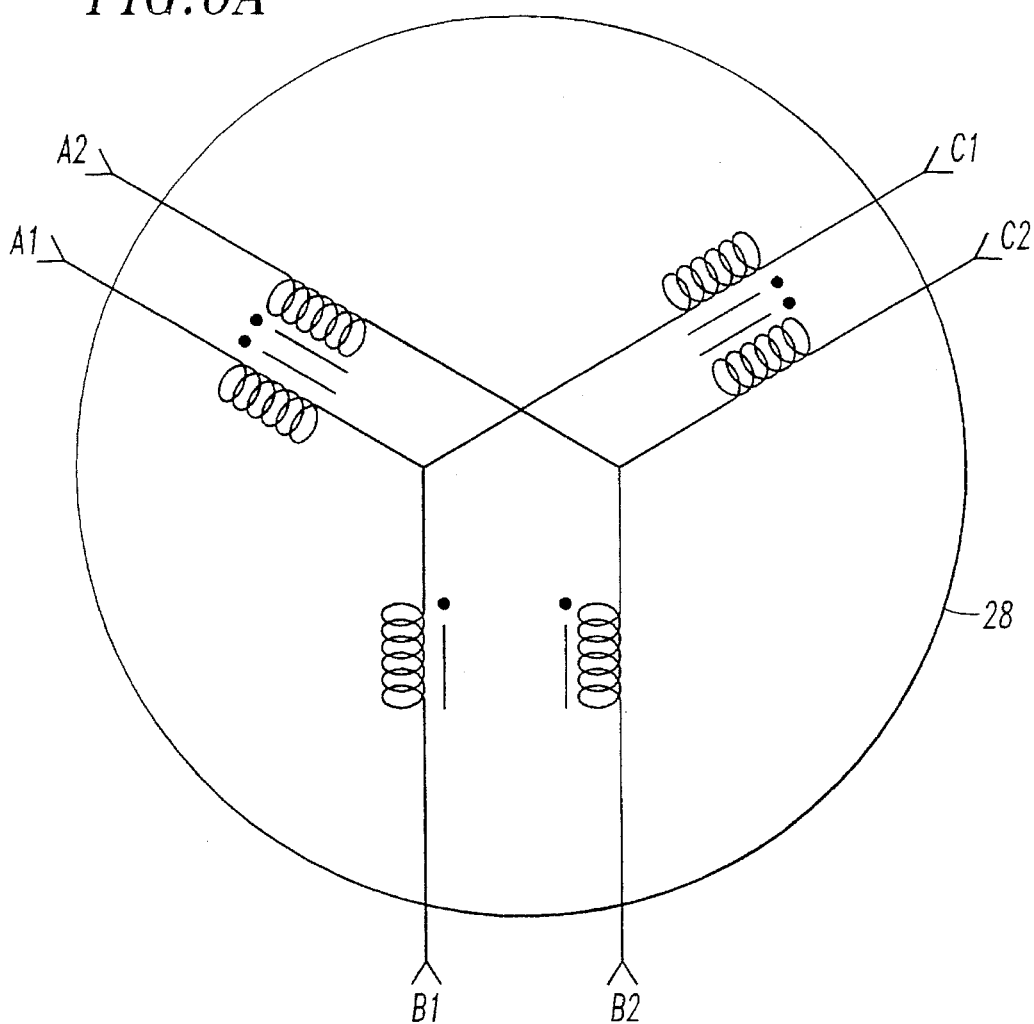
FIG. 6A is a schematic diagram of the motor of the electric vehicle propulsion system of FIG. 1.
Figure 6B:
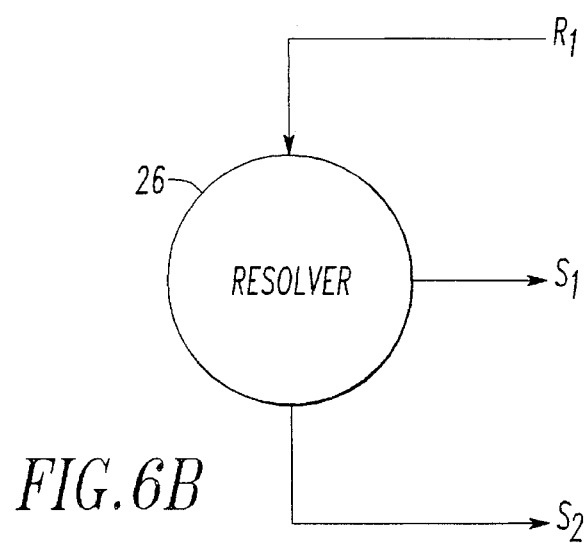
FIG. 6B is a schematic diagram of the resolver of the electric vehicle propulsion system of FIG. 1.

The resolver 26 is illustrated in FIG. 6B and is positioned proximate to the motor 28 for detecting the angular position of the motor shaft and for providing signals indicative of the angular position of the motor shaft to the motor controller 18. The reference signal line $R_1$ connected to the resolver is for a positive or negative reference value indicating the angular position of the motor shaft. The $S_1$ signal line from the resolver provides a positive or negative sine value for the angular position of the motor shaft and the $S_2$ signal line from the resolver provides a positive or negative cosine value for the angular position of the motor shaft.

The resolver 26 can comprise a commercially available resolver or other resolver known in the art. Reference signals for the resolver 26 are provided by the motor controller 18.

The chassis controller 22 and the motor controller 18 receive signals from a vehicle communication bus. Generally, the vehicle communication bus serves as a communication pathway for interfacing various vehicle sensors and controllers to the chassis controller 22 and the motor controller 18, as will be explained in more detail below.

The chassis controller 22 comprises a microprocessor-based digital and analog electronics system and provides control and status interfacing to the vehicle's sensors and controllers and to the motor controller 18. For example, the chassis controller 22 is connected, via the vehicle communication bus, to the vehicle key switch, accelerator, brake, and drive selector switches. The chassis controller 22 interprets signals from these switches to provide the motor controller 18 with start-up, drive mode (e.g., forward, reverse, and neutral), motor torque, regenerative braking, shutdown, and built-in test (BIT) commands. Preferably, the chassis controller 22 communicates with the motor controller 18 via an opto-coupled serial data interface and receives status signals from the motor controller 18 of all the commands sent to verify the communication links between the chassis controller 22, the vehicle, and the motor controller 18 and to verify that the vehicle is operating properly. It should be appreciated that because the chassis controller 22 provides the control and status interfacing to the vehicle's sensors and controllers and to the motor controller 18, the electric vehicle propulsion system 10 can be modified for use with any number of different vehicles simply by modifying the chassis controller 22 for a particular vehicle.

The chassis controller 22 also provides battery management capabilities by using signals received over the vehicle communication bus from a battery current sensor located in the power distribution module 20. The chassis controller 22 interprets signals from the battery current sensor, provides charging commands to the motor controller 18, and sends a state-of-charge value to a "fuel" gauge on the vehicle dashboard. The chassis controller 22 further connects, via the vehicle communication bus, to vehicle controllers including odometer, speedometer, lighting, diagnostic and emissions controllers, as well as to an RS-232 interface for system development.

As shown in FIG. 4, the motor controller 18 includes a low voltage power supply 42, an input filter and DC relay control unit 44, a vector control board 46, and first and second power bridges and gate drives 48 and 50, respectively. The low voltage power supply 42 converts the 12 volt output from the DC/DC converter 38 to provide +5V, +/−15V, and +20V outputs to the input filter and DC relay control unit 44, the vector control board 46, the first power bridge 48, and the second power bridge 50. The low voltage power supply 42 can comprise a commercially available power supply as is known in the art.

The input filter and DC relay control unit 44 includes electrical connections for coupling the 320 volt output of the power distribution module 20 to the first and second power bridges 48 and 50, respectively. The input filter and DC relay control unit 44 includes EMI filtering, a relay circuit for disconnecting the coupling of the 320 volt output of the power distribution module 20 to the first and second power bridges 48 and 50, respectively, and various BIT circuits including voltage sense circuits and a chassis ground fault circuit. Preferably, the input filter and DC relay control unit 44 receives control signals from and sends status signals, e.g., BIT signals, to the vector control board 46.

The vector control board 46 comprises a microprocessor based digital and analog electronics system. As its primary function, the vector control board 46 receives driver-initiated acceleration and braking requests from the chassis controller 22. The vector control board 46 then acquires rotor position measurements from the resolver 26 and current measurements from the first and second power bridges 48 and 50, respectively, and uses these measurements to generate pulse width modulated (PWM) voltage waveforms for driving the first and second power bridges 48 and 50, respectively, to produce the desired acceleration or braking effects in the motor 28. The PWM voltage waveforms are generated in accordance with a control program which is designed to result in a requested torque output. As described above, the vector control board 46 also has the function of controlling the input filter and DC relay control unit 44, the oil pump unit 34, the radiator/fan 36, the battery charger 16, the input filter and DC relay control unit 44, built in test circuitry, vehicle communication, and fault detection.

As shown in FIG. 6A, the motor 28 is a 3-phase AC induction motor having two identical, electrically isolated, windings per phase (windings A1 and A2 are for the "A" phase, windings B1 and B2 are for the "B" phase, and windings C1 and C2 are for the "C" phase) for producing high torque at zero speed to provide performance comparable to conventional gas-driven engines. The shaft (not shown) of the motor 28 is coupled to the vehicle transaxle (not shown). Preferably, the two windings in each phase of the motor 28 are aligned substantially on top of one another and are electrically in phase such that each winding provides approximately half the total power of the phase. Also the motor 28 is preferably completely sealed and utilizes spray-oil cooling to remove heat directly from the rotor and end windings to increase reliability.

Figure 7:
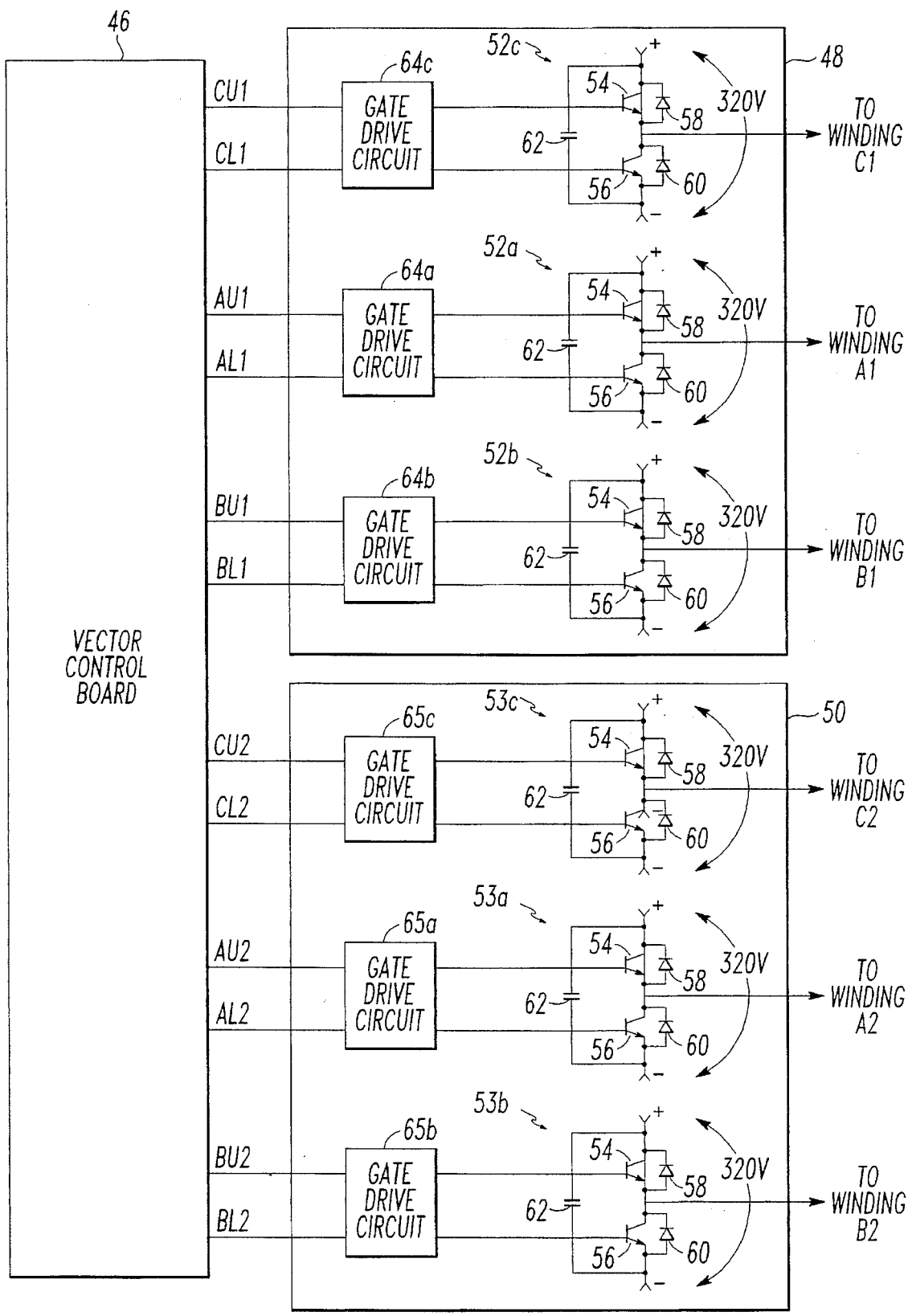
FIGS. 7 and 8 are schematic diagrams of the power bridges of the motor controller of FIG. 4.

As shown in FIG. 7, the first power bridge 48 includes three insulated gate bipolar transistor (IGBT) switching circuits 52a, 52b, and 52c and the second power bridge 50 includes three IGBT switching circuits 53a, 53b, and 53c. The IGBT switching circuits 52a, 52b, and 52c apply drive currents to windings A1, B1, and C1, respectively, of the motor 28. Similarly, the IGBT switching circuits 53a, 53b, and 53c apply drive currents to windings A2, B2, and C2, respectively, of the motor 28.

Each of the IGBT switching circuits 52a, 52b, 52c, 53a, 53b, and 53c includes upper and lower IGBTs 54 and 56, respectively, upper and lower diodes 58 and 60, respectively, and a capacitor 62 connected as shown in FIG. 7. Preferably, the IGBT switching circuits 52a, 52b, 52c, 53a, 53b, and 53c are all identical such that each of the first and second power bridges 48 and 50, respectively, provides half the total drive current to the windings of the motor 28, thereby allowing the use of readily available, low cost IGBT switching circuits. It is contemplated that the IGBT switching circuits 52a, 52b, 52c, 53a, 53b, and 53c can be replaced with other switching circuits known in the art.

As also shown in FIG. 7, the first power bridge 48 further includes three gate drive circuits 64a, 64b, and 64c and the second power bridge 50 further includes three gate drive circuits 65a, 65b, and 65c. The gate drive circuits 64a, 64b, and 64c receive PWM voltage waveforms in the form of gate drive signals AU1 and AL1, gate drive signals BU1 and BL1, and gate drive signals CU1 and CL1, respectively, from the vector control board 46. Likewise, the gate drive circuits 65a, 65b, and 65c receive PWM voltage waveforms in the form of gate drive signals AU2 and AL2, gate drive signals BU2 and BL2, and gate drive signals CU2 and CL2, respectively, from the vector control board 46. The gate drive circuits 64a, 64b, and 64c and the gate drive circuits 65a, 65b, and 65c level-shift the received gate drive signals and apply the level-shifted gate drive signals to the IGBT switching circuits 52a, 52b, 52c, 53a, 53b, and 53c as shown in FIG. 7 to drive the IGBT switching circuits 52a, 52b, 52c, 53a, 53b, and 53c. It is contemplated that each of the gate drive circuits 64a, 64b, 64c, 65a, 65b, and 65c can comprise, for example, a Fuji EXB841 Gate Drive Hybrid or other similar device known in the art.

Figure 8:
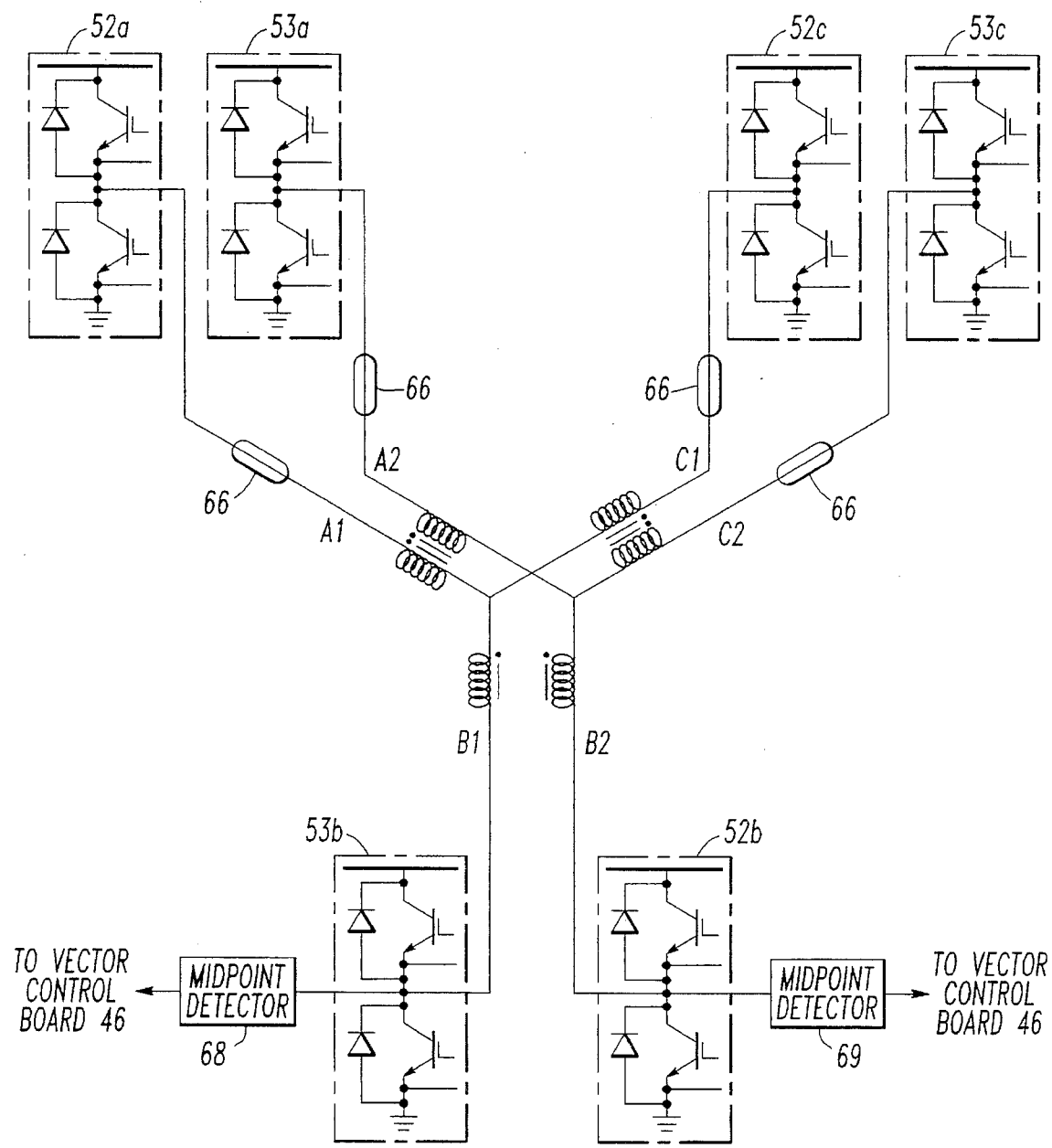

As shown in FIG. 8, current sensors 66 are provided at windings A1, A2, C1, and C2 of the motor 28. As described above, the vector control board 46 uses current measurements from the current sensors 66 to generate the gate drive signals AU1, AL1, BU1, BL1, CU1, and CL1. Placement of the current sensors 66 can be varied as is known in the art. For example, instead of being provided at windings A1, A2, C1, and C2, the current sensors 66 could alternatively be provided at windings A1, A2, B1, and B2 or at windings B1, B2, C1, and C2.

As also shown in FIG. 8, midpoint detectors 68 and 69 are provided at each of windings B1 and B2, respectively, of the motor 28. As will be described in more detail below, the midpoint detectors 68 and 69 are used to automatically detect and isolate transistor failures in the IGBT switching circuits 52a, 52b, 52c, 53a, 53b, and 53c.

Figure 9:
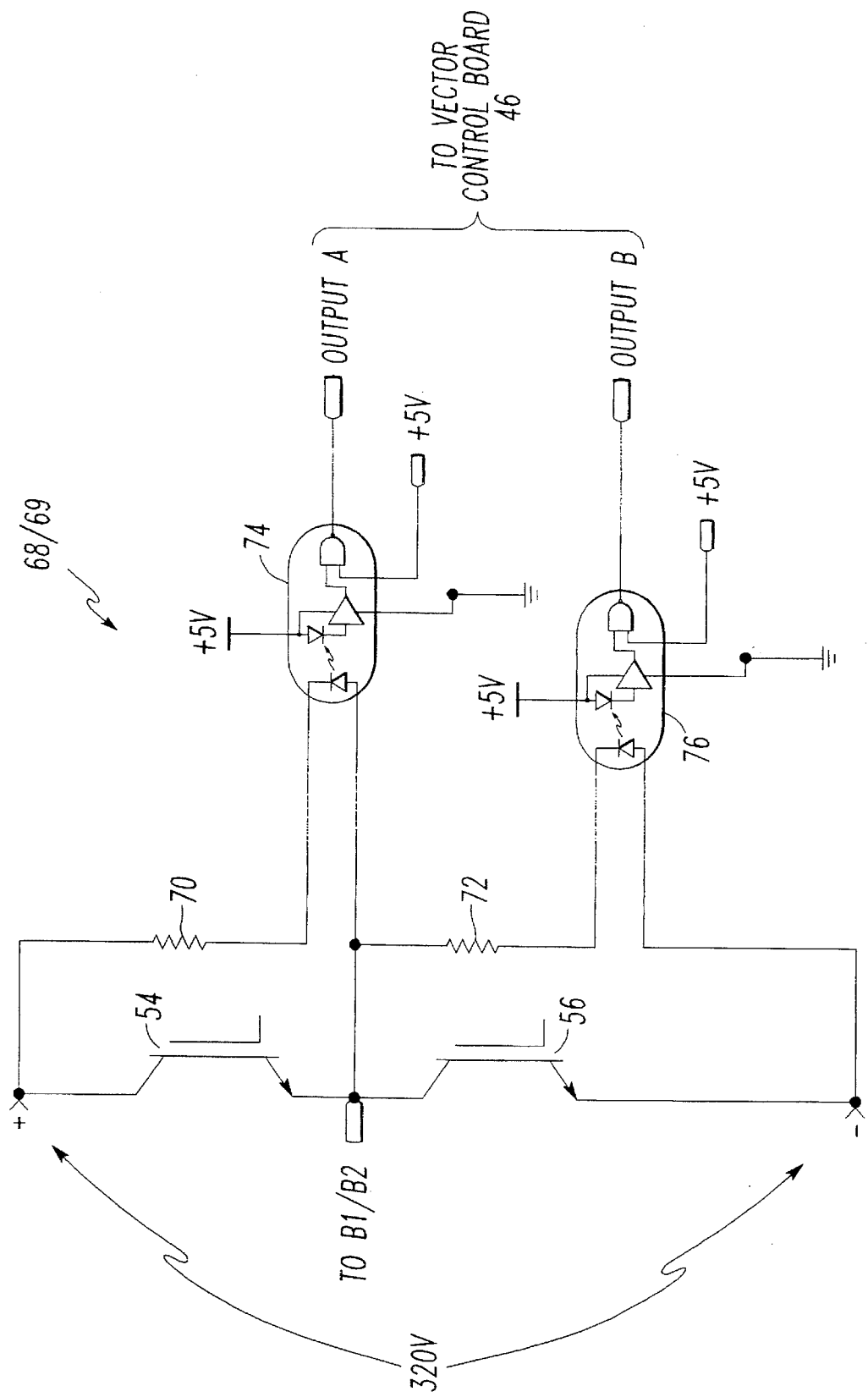
FIG. 9 is a schematic diagram of a midpoint detector.

As shown in FIG. 9, each of midpoint detectors 68 and 69 includes a pair of resistors 70 and 72 and a pair of opto-couplers 74 and 76 connected as shown. A series combination of the resistor 70 and the opto-coupler 74 is connected in parallel with the upper IGBT 54 of phase B, and the series combination of the resistor 72 and the opto-coupler 76 is connected in parallel with the lower IGBT 56 of phase B. Each of the opto-couplers 74 and 76 can comprise, for example, a Toshiba H11L1F1 Opto-Coupler or other similar device known in the art. Although FIG. 9 shows that the opto-couplers 74 and 76 are of the inverting type, the opto-couplers 74 and 76 can alternatively be of the non-inverting type as is also known in the art. Further, the values of the resistors 70 and 72 are chosen such that the resistors 70 and 72 excite the input LEDs of the opto-couplers 74 and 76, respectively, with both half and full operating voltage across the IGBT switching circuits 52b and 53b. Thus, the presence of at least half voltage across the upper or lower IGBT 54 or 56 will result in generation of a signal at the output of the respective opto-couplers 74 or 76. The logic of the midpoint detectors 68 and 69 of FIG. 9 is summarized in Table I below.

Testing of the IGBT switching circuits 52a, 52b, 52c, 53a, 53b, and 53c is carried out by the vector control board 46, preferably, during a start up diagnostic routine or during a fault detection routine. It is contemplated, however, that testing of the IGBT switching circuits 52a, 52b, 52c, 53a, 53b, and 53c can also be carried out by an external diagnostics computer at a repair facility.

Proper operation of the first and second power bridges 48 and 50, respectively, will exhibit the following characteristics when their IGBTs are selectively activated in a test mode:

TABLE I

| UPPER SWITCH 54 | LOWER SWITCH 56 | OUTPUT A | OUTPUT B |
| --- | --- | --- | --- |
| On | On | High | High |
| On | Off | High | Low |
| Off | On | Low | High |
| Off | Off | Low | Low |

Figure 10:
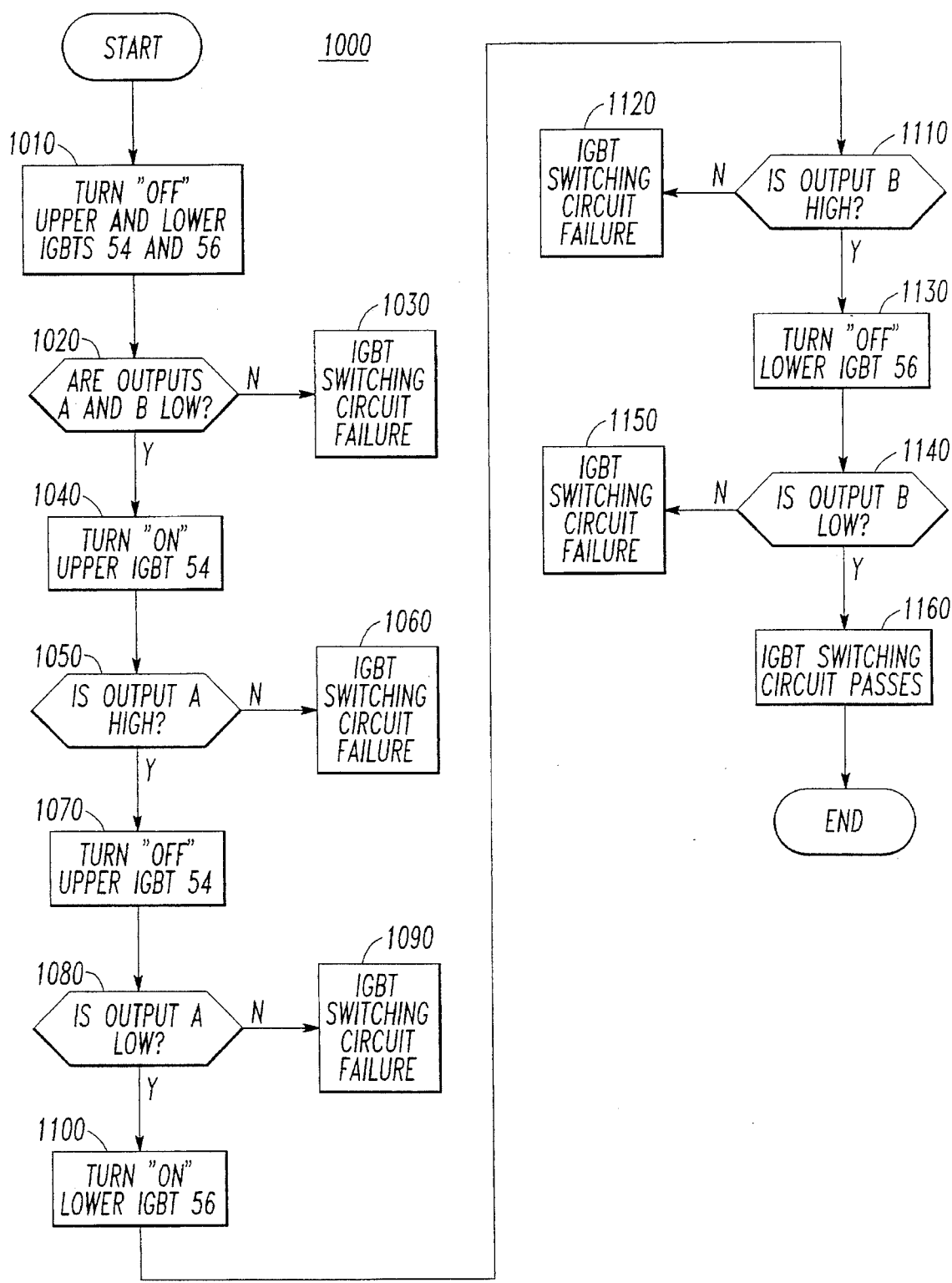
FIG. 10 is a flow diagram of the operation of the midpoint detector of FIG. 9.

Testing of the IGBT switching circuits 52a, 52b, 52c, 53a, 53b, and 53c by the vector control board 46 will now be described with reference to the flow diagram of FIG. 10. It should be understood that the procedure of FIG. 10 is performed sequentially by the vector control board 46 for each of the IGBT switching circuits 52a, 52b, 52c, 53a, 53b, and 53c.

In step 1010, the vector control board 46 turns "off" both the upper IGBT 54 and the lower IGBT 56. Control then passes to step 1020.

In step 1020, the vector control board 46 detects output A and output B from the opto-couplers 74 and 76, respectively. If either output A or output B is "high," control passes to step 1030 and the IGBT switching circuit is considered to have failed. If, however, both output A and output B are "low," control passes to step 1040.

In step 1040, the vector control board 46 turns "on" the upper IGBT 54. Control then passes to step 1050.

In step 1050, the vector control board 46 detects output A from the opto-coupler 74. If output A is "low," control passes to step 1060 and the IGBT switching circuit is considered to have failed. If, however, output A is "high," control passes to step 1070.

In step 1070, the vector control board 46 turns "off" the upper IGBT 54. Control then passes to step 1080.

In step 1080, the vector control board 46 detects output A from the opto-coupler 74. If output A is "high," control passes to step 1090 and the IGBT switching circuit is considered to have failed. If, however, output A is "low," control passes to step 1100.

In step 1100, the vector control board 46 turns "on" the lower IGBT 56. Control then passes to step 1110.

In step 1110, the vector control board 46 detects output B from the opto-coupler 76. If output B is "low," control passes to step 1120 and the IGBT switching circuit is considered to have failed. If, however, output B is "high," control passes to step 1130.

In step 1130, the vector control board 46 turns "off" the lower IGBT 56. Control then passes to step 1140.

In step 1140, the vector control board 46 detects output B from the opto-coupler 76. If output B is "high," control passes to step 1150 and the IGBT switching circuit is considered to have failed. If, however, output B is "low," control passes to step 1160 and the IGBT switching circuit is considered to have passed.

Testing of the IGBT switching circuits 52a, 52b, 52c, 53a, 53b, and 53c, is thus performed by operating the vector control board 46 to sequentially switch the upper transistor 54 and lower transistor 56 between "on" and "off" states, monitor the upper transistor 54 and lower transistor 56 to determine whether they operate between the "on" and "off" states when selectively switched, and indicate a failure of the IGBT switching circuit when at least one of the upper transistor 54 and lower transistor 56 does not operate between the "on" and "off" states when selectively switched. If an output of one of the midpoint detectors 68 and 69 does not agree with the logic of Table I above, the IGBT switching circuit that includes the transistor that produced the incorrect output is considered faulty. If all the IGBT switching circuits of a set of windings are found faulty, however, the midpoint detector for that set of windings is considered faulty. Testing of the IGBT switching circuits 52a, 52b, 52c, 53a, 53b, and 53c is summarized in Table II and Table III below, wherein "Lwr" designates a lower transistor 56, "Upr" designates an upper transistor 54, "P" designates a passing transistor, and "F" designates a failed transistor.

TABLE II

| IGBT 52a | | IGBT 52b | | IGBT 52c | | |
|---|---|---|---|---|---|---|
| Lwr | Upr | Lwr | Upr | Lwr | Upr | FAILED IGBT |
| F | P | P | P | P | P | 52a |
| P | F | P | P | P | P | 52a |
| P | P | F | P | P | P | 52b |

TABLE II-continued

| IGBT 52a | | IGBT 52b | | IGBT 52c | | |
|---|---|---|---|---|---|---|
| Lwr | Upr | Lwr | Upr | Lwr | Upr | FAILED IGBT |
| P | P | P | F | P | P | 52b |
| P | P | P | P | F | P | 52c |
| P | P | P | P | P | F | 52c |
| F | F | F | F | F | F | Mpt Det 68 |

TABLE III

| IGBT 53a | | IGBT 53b | | IGBT 53c | | |
|---|---|---|---|---|---|---|
| Lwr | Upr | Lwr | Upr | Lwr | Upr | FAILED IGBT |
| F | P | P | P | P | P | 53a |
| P | F | P | P | P | P | 53a |
| P | P | F | P | P | P | 53b |
| P | P | P | F | P | P | 53b |
| P | P | P | P | F | P | 53c |
| P | P | P | P | P | F | 53c |
| F | F | F | F | F | F | Mpt Det 69 |

It should be noted that because windings A1, B1, and C1 of the motor 28 present a DC short, as do windings A2, B2, and C2, only one midpoint detector per winding set (one midpoint detector for winding set A1, B1, and C2 and one midpoint detector for winding set A2, B2, and C2) is required as shown in FIG. 8. Further, although FIG. 8 shows that the midpoint detectors 68 and 69 are connected to windings B1 and B2, respectively, the midpoint detectors 68 and 69 can alternatively be connected to winding A1 and A2, respectively, or to winding C1 and C2, respectively, or a combination thereof. It should also be noted that if windings A1, B1, and C1 and windings A2, B2, and C2 did not present DC shorts, three midpoint detectors per winding set (one detector for each winding in the set) would be required.

It should be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

We claim:

1. A method for testing a power bridge for an electric vehicle propulsion system, the power bridge including a switching circuit having first and second switching elements operable between "on" and "off" states, the method comprising the steps of:

selectively switching the first and second switching elements between the "on" and "off" states;

independently monitoring the first and second switching elements to determine whether the first and second switching elements operate in the "on" and "off" states when selectively switched;

simultaneously producing an output for each of the first and the second switching elements; and indicating a failure of the switching circuit when at least one of the first and second switching elements does not operate between the "on" and "off" states when selectively switched.

2. The method according to claim 1, wherein the step of monitoring the first and second switching elements includes the steps of detecting a voltage across the first switching element and detecting a voltage across the second switching element.

3. The method according to claim 2, wherein the step of indicating a failure of the switching circuit includes the steps of producing a first output signal having a first value upon detecting the voltage across the first switching element and producing a second output signal having the first value upon detecting the presence of the voltage across the second switching element.

4. The method according to claim 1, wherein the step of indicating a failure of the switching circuit includes the steps of producing a first output signal having a first value when the first switching element is in the "on" state, producing a second output signal having a second value when the first switching element is in the "off" state, producing the first output signal having the first value when the second switching element is in the "on" state, and producing the second output signal having the second value when the second switching element is in the "off" state.

5. The method according to claim 1, further comprising the step of providing gate drive signals to operate the first and second switching elements between the "on" and "off" states.

6. A method for testing a power bridge for an electric vehicle propulsion system, the power bridge including a plurality of switching circuits each having first and second switching elements operable between "on" and "off" states, the method comprising the steps of:

selectively switching the first and second switching elements between the "on" and "off" states;

independently and simultaneously monitoring the first and second switching elements of one of the plurality of switching circuits to determine whether the first and second switching elements of the one of the plurality of switching circuits operate between the "on" and "off" states when selectively switched;

simultaneously producing an output signal for each of the first and the second switching elements representing the operational status of each of said switches:

simultaneously analyzing the output signals to determine the operational status of the first and second switching, elements: and indicating a failure of the switching circuit when at least one of the output signals indicates that at least one of the first and second switching elements does not operate between the "on" and "off" states when selectively switched.

7. The method according to claim 6, further comprising the step of providing gate drive signals to operate respective ones of the first and second switching elements between the "on" and "off" states.

8. A switching circuit for a power bridge comprising:

first and second IGBT switches for selectively switching between an on and an off state;

plural test circuits, each of said test circuits in parallel with one of said switches for independently monitoring the operational status of said switch such that an output signal is generated when a selected amount of the operating voltage of said switch is detected across said switch, each of said test circuits comprising a resistor in series with an opto-coupler, where said opto-coupler includes an output indicating the operational status of one of said switches whereby the operational status of each of said switches may be monitored simultaneously and independently.

* * * * *